United States Patent
Filipovic et al.

(10) Patent No.: US 7,656,327 B2
(45) Date of Patent: Feb. 2, 2010

(54) SATURATION DETECTION FOR ANALOG-TO-DIGITAL CONVERTER

(75) Inventors: Daniel F. Filipovic, Solana Beach, CA (US); Christos Komninakis, La Jolla, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 11/564,546

(22) Filed: Nov. 29, 2006

(65) Prior Publication Data

US 2008/0018508 A1    Jan. 24, 2008

Related U.S. Application Data

(60) Provisional application No. 60/833,155, filed on Jul. 24, 2006.

(51) Int. Cl.
    *H03M 1/62* (2006.01)
(52) U.S. Cl. ......................... 341/139; 341/155
(58) Field of Classification Search ................. 341/143, 341/144, 155, 139, 118, 156, 158, 131
    See application file for complete search history.

(56) References Cited

U.S. PATENT DOCUMENTS

| | | | | |
|---|---|---|---|---|
| 4,043,175 | A | * | 8/1977 | Fredriksson et al. .......... 367/13 |
| 6,031,478 | A | | 2/2000 | Oberhammer et al. |
| 6,868,263 | B2 | | 3/2005 | Filipovic |
| 6,940,442 | B2 | | 9/2005 | Van Schendel et al. |
| 6,950,641 | B2 | | 9/2005 | Gu |
| 7,151,473 | B2 | * | 12/2006 | Fontaine et al. ............. 341/139 |
| 7,292,169 | B2 | * | 11/2007 | Mori et al. .................. 341/139 |
| 2002/0160733 | A1 | * | 10/2002 | Kajita ..................... 455/234.1 |
| 2004/0242172 | A1 | * | 12/2004 | Haim et al. .............. 455/127.2 |

FOREIGN PATENT DOCUMENTS

| | | |
|---|---|---|
| GB | 2369258 | 5/2002 |
| GB | 2407012 | 4/2005 |
| WO | 00024167 | 4/2000 |
| WO | 01019048 | 3/2001 |
| WO | 02067420 | 8/2002 |

OTHER PUBLICATIONS

International Search Report —PCT/US07/074271 —International Search Authority —European Patent Office —Nov. 27, 2007.

* cited by examiner

*Primary Examiner*—Brian Young
(74) *Attorney, Agent, or Firm*—Kenyon S. Jenckes; William M. Hooks

(57) ABSTRACT

This disclosure describes techniques for detecting or predicting saturation of an analog-to-digital converter. The techniques analyze digital samples following analog-to-digital conversion, and count occurrences of specific values associated with a subset of bits within the digital samples. The specific subset of bits that are used detect or predict saturation may vary depending on the analog-to-digital converter and the number of bits in the digital samples. However, the techniques avoid the need to consider every bit in the digital samples, and rely only on a subset of bits (one or more), which can simplify the counting algorithms used in the saturation detection or prediction. Upon identifying a probable saturation state of the analog-to-digital converter based on the counting, the techniques may de-boost the gain of an analog amplifier. This can effectively extend the dynamic range of the analog-to-digital converter.

30 Claims, 7 Drawing Sheets

SATURATION DETECTION FOR ANALOG-TO-DIGITAL CONVERTER

This application claims priority to U.S. Provisional Application No. 60/833,155, filed Jul. 24, 2006 entitled Dynamic Range Extension for A/D's.

TECHNICAL FIELD

This disclosure relates to analog-to-digital converters commonly used in wireless communication devices, and more particularly techniques for detecting or predicting saturation of analog-to-digital converters.

BACKGROUND

Analog-to-digital converters are commonly used in a wide variety of applications, including applications in a number of different types of wireless communication devices. Analog-to-digital converters are used to convert an analog signal into digital samples of the analog signal. In wireless communication, for example, analog waveforms may be received and processed in the analog domain, and then converted into the digital domain where information is demodulated. In the analog domain, for example, baseband signals are typically downconverted in frequency from carrier-modulated waveforms. The baseband signals may then be converted to digital samples, which can be demodulated in the digital domain. A variety of signal processing, such as filtering and scaling, is typically performed in both the analog an digital domains.

One type of analog-to-digital converter common in wireless communication applications, as well as other applications, is referred to as a sigma-delta ("ΣΔ") analog-to-digital converter. ΣΔ analog-to-digital converters are particularly useful for wireless communication applications because they can shape quantization noise and push the quantization noise into frequencies that are outside of the frequencies specifically used for the wireless communication. This allows the converted digital samples to include a higher percentage of the signals of interest. A wide variety of other types of analog-to-digital converters also exist, and each respective analog-to-digital converter may be defined to output digital samples at one of several possible bit lengths.

One common problem with analog-to-digital converters is the possibility of saturation. In particular, each analog-to-digital converter has a dynamic range, and if signal power exceeds the dynamic range, the analog-to-digital converter will generate digital samples at the maximum of this dynamic range. If the analog signals exceed this maximum, the signals can be clipped and inaccurately represented by several successive maximum values by the analog-to-digital converter. When such saturation of the analog-to-digital converter occurs, information can be lost.

In wireless communication, saturation can sometimes occur due to "jammer" signals. Jammer signals refer to noise signals that do not correspond to the wireless signals supported by the respective wireless communication device. Jammer signals may be caused by signals sent from other devices operating according to protocols not supported by a device in question, signals emitted from microwave ovens, cordless telephones, other electromagnetic emitting devices, or the like. Jammer signals can be either constant or intermittent. In any case, jammer signals can sometimes cause saturation in the analog-to-digital converter and thereby undermine the ability to demodulate the signals of interest.

SUMMARY

This disclosure describes techniques for detecting or predicting saturation of an analog-to-digital converter. The techniques analyze digital samples following analog-to-digital conversion, and count occurrences of specific values (i.e. 1's or 0's) associated with one or more specific bits within the digital samples. The specific subset of bits that are used detect or predict saturation may vary depending on the type of analog-to-digital converter and the number of bits in the digital samples.

The described techniques avoid the need to consider every bit in the digital samples, and rely only on a subset of bits, which can simplify the counting algorithms used in the saturation detection or prediction. Upon identifying a probable saturation state of the analog-to-digital converter based on the counting, the techniques may de-boost (i.e., decrease) the gain of an analog amplifier. This can effectively extend the range of the analog-to-digital converter. Following a de-boost, the techniques may continue counting in order to identify when a re-boost (i.e., an increase) of the gain of the analog amplifier is desirable. The described techniques may be particularly useful in wireless communication devices.

In one embodiment, this disclosure provides a method comprising receiving an analog signal, converting the analog signal to digital samples via an analog-to-digital converter, counting occurrences of particular values of a subset of bits within the digital samples, and identifying a probable saturation state of the analog-to-digital converter based on the counting.

In another embodiment, this disclosure provides a device comprising an analog-to-digital converter that converts a received analog signal to digital samples, and a saturation detection unit that counts occurrences of particular values of a subset of bits within the digital samples and identifies a probable saturation state of the analog-to-digital converter based on the counts.

In another embodiment, this disclosure provides a wireless communication device comprising a first amplifier comprising a low noise amplifier (LNA) that amplifies a received wireless signal, a mixer that generates a baseband signal based on the received wireless signal, a coarse DC offset unit that removes DC offset from the baseband signal, a filter that filters the baseband signal following removal of the DC offset, a second amplifier that amplifies the baseband signal following the filtering, an analog-to-digital converter that converts the baseband signal to digital samples, and a multi-stage digital filter that digitally filters the digital samples. In addition, the wireless communication device includes a saturation detection unit that counts values of a subset of bits within the digital samples and identifies a probable saturation state of the analog-to-digital converter based on the counts, wherein the saturation detection counts occurrences of particular values associated with output of a first stage of the multi-stage digital filter and causes gain reductions and increases to the second amplifier based on the counts. The wireless communication device also includes a fine DC offset unit that removes DC offset from the digital samples following digital filtering, a rotator that adjusts the digital samples to account for frequency variations, a digital variable gain amplifier (DVGA) that amplifies the digital samples, and an automatic gain control (AGC) unit to control gain of the DVGA.

In another embodiment, this disclosure provides a device comprising means for converting a received analog signal to digital samples, means for counting occurrences of particular values of a subset of bits within the digital samples, and means for identifying a probable saturation state of the analog-to-digital converter based on the counting.

Additional details of various embodiments are set forth in the accompanying drawings and the description below. Other features, objects and advantages will become apparent from the description and drawings, and from the claims.

DETAILED DESCRIPTION

This disclosure describes fast and reliable techniques for detecting or predicting saturation of an analog-to-digital converter. The techniques analyze digital samples following analog-to-digital conversion, and count specific values associated with one or more specific bits (a subset) within the digital samples. The digital samples may comprise the direct output of the analog-to-digital converter, or possibly filtered output, e.g., from a first stage of a multi-stage digital filter that operates on the output of the analog-to-digital. The specific subset of bits that are used to detect or predict saturation may vary depending on the analog-to-digital converter and the number of bits in the digital samples. The techniques may avoid the need to consider every bit in the digital samples, and instead rely only on a subset of bits (one or more), which can simplify the counting algorithms used in the saturation detection or prediction.

The techniques may use statistical percentages to identify a probable saturation state. As a very simple illustration, for example, if the most significant bit of a set of digital samples is non-zero more than 30 percent of the time, this may indicate a high likelihood of saturation regardless of the values of the other bits of the sample. According to this disclosure, the value of one or more of the most significant bits can be counted for discrete periods of time, or possibly over a sliding window of samples. If the most significant bit is non-zero more than 30 percent of the time (or greater than some other defined threshold), a probable saturation state of the analog-to-digital converter may be identified. In other cases, other subsets of bits (and in some cases the least significant bit) may be counted and used to improve resolution of the saturation detection, and possibly predict saturation prior to the saturation occurring. The subset of bits that are counted may depend on the bit length of the output of the analog-to-digital converter, the bit length of the output of a filter that follows the analog-to-digital converter, the bit-notation used in the digital samples, or other factors.

In any case, upon identifying a probable saturation state of the analog-to-digital converter based on the counting, the techniques may de-boost the gain of an analog amplifier. This can effectively extend the range of the analog-to-digital converter, and for wireless communication, can help in dealing with jammer signals, which can be viewed as undesirable noise. Following a de-boost of the gain of the analog amplifier, additional counting techniques may be used to identify when it is desirable to re-boost the gain back to the original state. The described techniques may be particularly useful in wireless communication devices, but may also find application in other devices that use one or more analog-to-digital converters.

Figure 1:
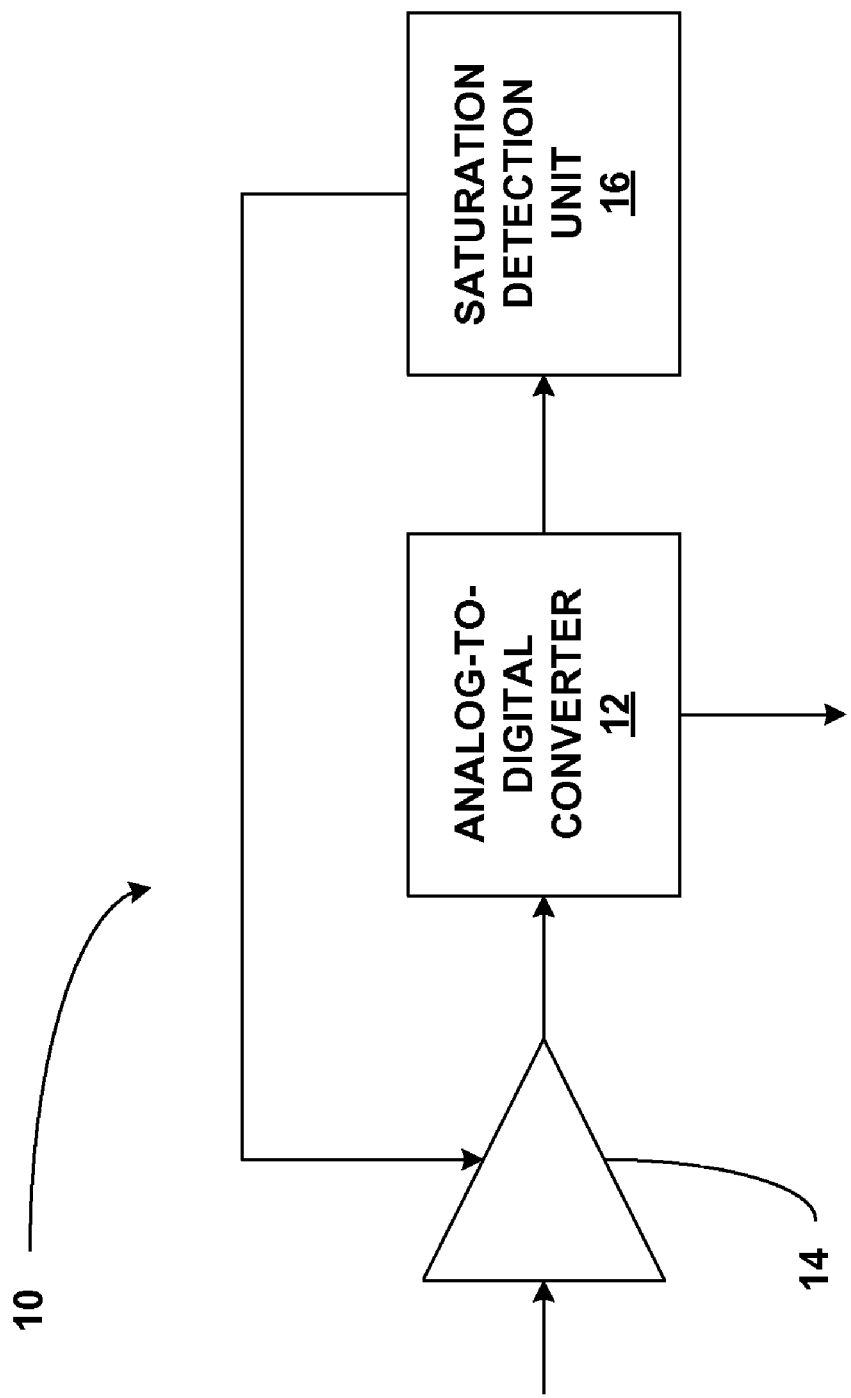
FIG. 1 is a block diagram illustrating components of a device including an analog-to-digital converter that implements saturation detection techniques in accordance with this disclosure.

FIG. 1 is an exemplary block diagram illustrating components of a device 10 that may implement the saturation detection techniques of this disclosure. Device 10 may comprise any device that makes use of an analog-to-digital converter 12. Depending on the type of device, many other analog components may exist prior to amplifier 14 and many other digital components may exist after analog-to-digital converter 12. In one example, device 10 may comprise a wireless communication device, in which case an analog receiver, a low noise amplifier (LNA), a mixer, various filters, and the like, may exist prior to amplifier 14. In this case, digital filters, a rotator, a digital amplifier, a demodulator, and the like, may also exist after analog-to-digital converter 12. Again, however, the techniques of this disclosure may be useful for many different types of devices that use one or more analog-to-digital converters.

Device 10 includes an amplifier 14 to amplifies an analog signal and an analog-to-digital converter 12 that converts the analog signal to digital samples. By way of example, analog-to-digital converter 12 may comprise a so called sigma-delta ("ΣΔ") analog-to-digital converter that shapes quantization noise and pushes such quantization noise to frequencies that are outside of the frequencies specifically of interest to device 10.

Amplifier 14 may be controllable via an adjustable gain, and the adjustable gain may be de-boosted and re-boosted, i.e., reduced and increased, to help avoid saturation in analog-to-digital converter 12 and to achieve good resolution in the digital samples. In particular, it may be desirable to apply gains to amplifier 14 that will sufficiently amplify the analog signal, but not over-amplify the signal such that saturation will occur in analog-to-digital converter 12. Jammer signals can sometimes introduce significant power surges in the received signal. In this case, de-boosting the gain may help to avoid saturation in the presence of such jammer signals. In wireless communication, jammer signals refer to noise signals that do not correspond to the wireless signals supported by the respective wireless communication device.

In accordance with this disclosure, device 10 includes a saturation detection unit 16, which detects or predicts whether the output 15 of analog-to-digital converter 12 is (or will become) saturated. If desired, saturation detection unit 16 may also provide feedback to amplifier 14. In this case, upon detecting a probable saturation state of analog-to-digital converter 12, saturation detection unit 16 may issue a command to amplifier 14 or otherwise cause amplifier 14 to de-boost (reduce) its gain. Then, following a de-boost of the gain of amplifier 14, if saturation detection unit 16 identifies a probable non-saturation state associated with a potential re-boost (increase) of the analog gain, saturation detection unit 16 may issue another command or otherwise cause amplifier 14 to re-boost the gain. Several levels of de-boosting (and re-boosting) of the gain may be supported. In any case, although the saturation detection techniques of this disclosure are described in the context of wireless communication and analog amplifier gain adjustment, the saturation detection techniques may also be used for other purposes or other types of devices that include one or more analog-to-digital converters.

In accordance with this disclosure, saturation detection unit 16 implements counting techniques that count the occurrences of values of specific bits of the digital samples. In other words, saturation detection unit 16 counts 1's or 0's associated with a specific subset of bits (one or more) of the digital samples. Accordingly, saturation detection unit 16 avoids the need to consider every bit of the digital values or to determine that the digital values are at a maximum. Instead, saturation detection unit 16 simply considers a subset of the bits (one or more), which can indicate high probability of saturation or help predict that saturation is approaching. The specific subset of bits that are used detect or predict saturation may vary depending on the type of analog-to-digital converter 12, the number of bits in the digital samples generated by analog-to-digital converter 12, the bit-notation used in the digital samples, or possibly other factors.

Furthermore, saturation detection unit 16 may use statistical percentages to identify a probable saturation state. If the most significant bit of a set of digital samples is non-zero more than threshold percent of the time, this may indicate a high likelihood of saturation, regardless of the values of the other bits of the sample. If analog-to-digital converter 12 is non-saturated, for example, the likelihood that the most significant bit will be non-zero may be very low. By establishing a threshold for the most significant bit being valid (of say 30 percent), saturation can be identified as statistically probable based on a subset of bits that includes a single bit, such as the most significant bit.

Once saturation detection unit 16 identifies that saturation is probable or likely, saturation detection unit 16 may issue a command back to amplifier 14 to cause amplifier 14 to de-boost its gain. Several de-boosts may be supported in some embodiments. Each successive de-boost command may cause, e.g., a 6 decibel reduction in the analog gain of amplifier 14. Following a de-boost, saturation detection unit 16 may continue to count samples in order to identify whether a re-boost can be performed to return the gain of amplifier 14 back to its original state. In this manner, the gain of amplifier 14 can be held at a more desirable high level unless or until signal strength (possibly due to jammer signals) exceeds the saturation threshold of analog-to-digital converter 12. Other techniques, rather than issuing commands from saturation detection unit 16 to amplifier 14 could also be used to cause the gain reductions or increases in amplifier when saturation detection unit 16 detects saturation or non-saturation.

Figure 2:
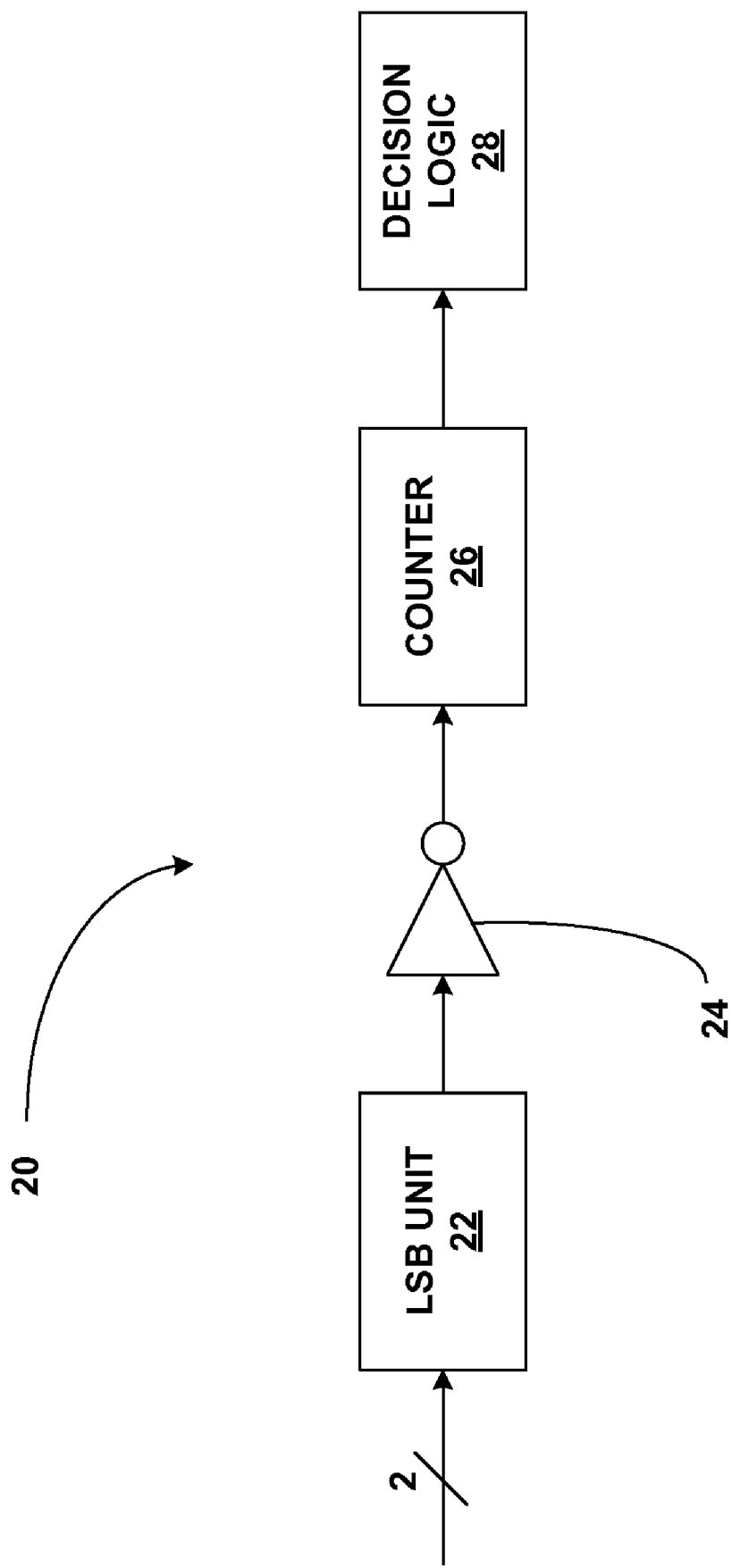
FIG. 2 is a block diagram of an exemplary saturation detection unit that may be used in the device shown in FIG. 1.

FIG. 2 is a block diagram of an exemplary saturation detection unit 20 that may correspond to unit 16 of device 10 shown in FIG. 1, particularly when analog-to-digital converter 12 outputs two-bit samples. Specifically, the notation of analog-to-digital converter 12 may use 2 bits to map to four different voltage levels. As an example, the voltage levels of (−3, −1, 1, 3) may be mapped respectively to the two-bit outputs of (00, 01, 11, 10), with the least significant bits (LSBs) appearing second. In this case, as shown in FIG. 2, the values associated with each LSB may be counted to determine likely saturation. In this notation, for example, the highest voltage levels (−3 and 3) are both represented by two-bit outputs that have zero values for the LSB.

In saturation detection unit 20 of FIG. 2, LSB unit 22 may receive two-bit digital samples and extract the least significant bit from each of the samples. Inverter 24 inverts the value of the least significant bit from each of the samples, and counter logic 26 counts the inverted values. Counter logic 26 may count for discrete time frames, e.g., over 4096 or 8192 samples. Alternatively, counter logic 26 may implement a sliding window of counts over sliding window of samples. Decision logic 28 determines whether the counts generated by counter logic 26 are indicative of saturation of the analog-to-digital converter, or whether the counts generated by counter logic 26 indicate that saturation is likely approaching.

The above is only an example for the case of two-bit analog-to-digital converters and a specific encoding of two output bits to identify four voltage levels. For any number of output bits ($\geq 2$) from the analog-to-digital converter and any mapping of output voltage levels to those output bits, it is possible to identify a subset of those output bits (one or more) and to implement simple combinatorial logic, the output of which indicates that the extreme output voltage levels (+/− max) of the analog-to-digital converter have been reached. This, in turn, indicates that the analog-to-digital converter is saturated or is approaching saturation. In the example above, the subset of bits is the LSB and a simple combinatorial logic performed on this bit is inversion.

In particular, a high number of occurrences of the LSB being zero indicates a high number of occurrences of extreme voltage levels at +/−3 volts. Furthermore, a high number of such occurrences is indicative of saturation. In the limit, when a two-bit $\Sigma\Delta$ analog-to-digital converter is completely saturated, the output may continuously toggle between the +/−3 voltage levels. For a given number of total events, the percentage of events "LSB=0" can be a good indication of the degree to which the amplified signal is saturated, particularly as that percentage becomes higher. Thus, decision logic 28 may establish a threshold for the percentage of events "LSB=0." If the LSB is zero for more than this percentage threshold, this can be identified as a probable saturation state. In this case, de-boosting techniques may be performed with respect to amplifier 14 to reduce the likelihood of continued saturation.

In some cases, decision logic 28 may implement several thresholds (e.g., threshold 1 and threshold 2) to facilitate de-boosting and re-boosting of the gain of the amplifier in response to saturation and likely non-saturation of the analog-to-digital converter. In addition, a de-boost flag may be used to prevent uncontrollable toggling between de-boosting and re-boosting. In an example, decision logic 28 may implement an algorithm similar to that provided below:

If (count>threshold 1)
   de-boost
   set de-boost flag=1;
If (count<threshold 2) & (de-boost flag=1)
   re-boost
   set de-boost flag=0.

A simulation was performed using the algorithm above in a saturation detection unit like that shown in FIG. 2 for a two-bit $\Sigma\Delta$ analog-to-digital converter. Based on the simulation, it was concluded that the counter should be active for a minimum of 2048 samples for the randomness of the quantization error to be insignificant. On the other hand, the counter should not be active for too long, for reasons of response speed. Lengths of 4096 or 8192 samples appear to be acceptable in addressing both randomness of the quantization error and adequate response speed.

Counter logic 26 may operate continuously, and decision logic 28 can make assessments each time the set length is reached. For example, after each 8192 samples, decision logic 28 may determine whether the threshold has been met sufficient to provoke a de-boost command. Alternatively, counter logic 26 could be designed to maintain a count over a sliding window of samples. The de-boost threshold (threshold 1) may be set at approximately 0.30, which will be crossed upwards when the signal approaches saturation levels. If the 0.30 threshold is crossed upward, this would indicate that the +/−3 volt maximum values were generated more than thirty percent of the time. The re-boost threshold (threshold 2) may indicate when it is safe to re-boost the analog gain, and may be set, e.g., at approximately 0.12. If the 0.12 threshold is crossed downward, this would indicate that the +/−3 volt maximum values were generated less than twelve percent of the time. The actual values of threshold 1 and threshold 2 will vary in different embodiments.

Furthermore, in other notations it may be better to count values of the most significant bits, e.g., depending on the notation used. The techniques of this disclosure may work with many different types of bit-notations and bit lengths. Importantly, the techniques count only a sub-set of the bits (one or more) associated with digital samples, and do not require a full analysis of every single bit of the samples. In some embodiments, like that outlined above, the techniques may include identifying a least significant bit of the digital values, inverting the least significant bit of the digital values, and counting values of different ones of the most significant bits. In other cases, the techniques may include identifying a most significant bit of the digital values, and counting occurrences of 1 in the most significant bit of the digital values. In still other cases, the techniques may include identifying a set of most significant bits of the digital values, and counting occurrences of 1 for different ones of the most significant bits.

In some wireless communication cases, it is desirable for the saturation detection unit to immediately follow an analog-to-digital converter. This is because digital filtering typically follows the analog-to-digital converter, and after digital filtering, jammer signals are typically suppressed, making the saturation of the analog-to-digital converter more difficult to detect. At the same time, however, after a first stage of multi-stage digital filter, better resolution of the power associated with a received signal is available. In particular, the digital samples usually include a larger number of bits (more resolution) following each stage of the digital filter. This disclosure also contemplates digitally filtering the digital samples, and counting occurrences of values of the subset of bits within the digital samples by counting occurrences of values associated with the digitally filtered digital samples. Furthermore, when a multi-stage digital filter is used, a good balance of increased resolution without suppression of jammer power may be achieved by using the output of a first stage of the digital filter. Details of such an embodiment may be found in the description of FIGS. 3-5 below.

Figure 3:
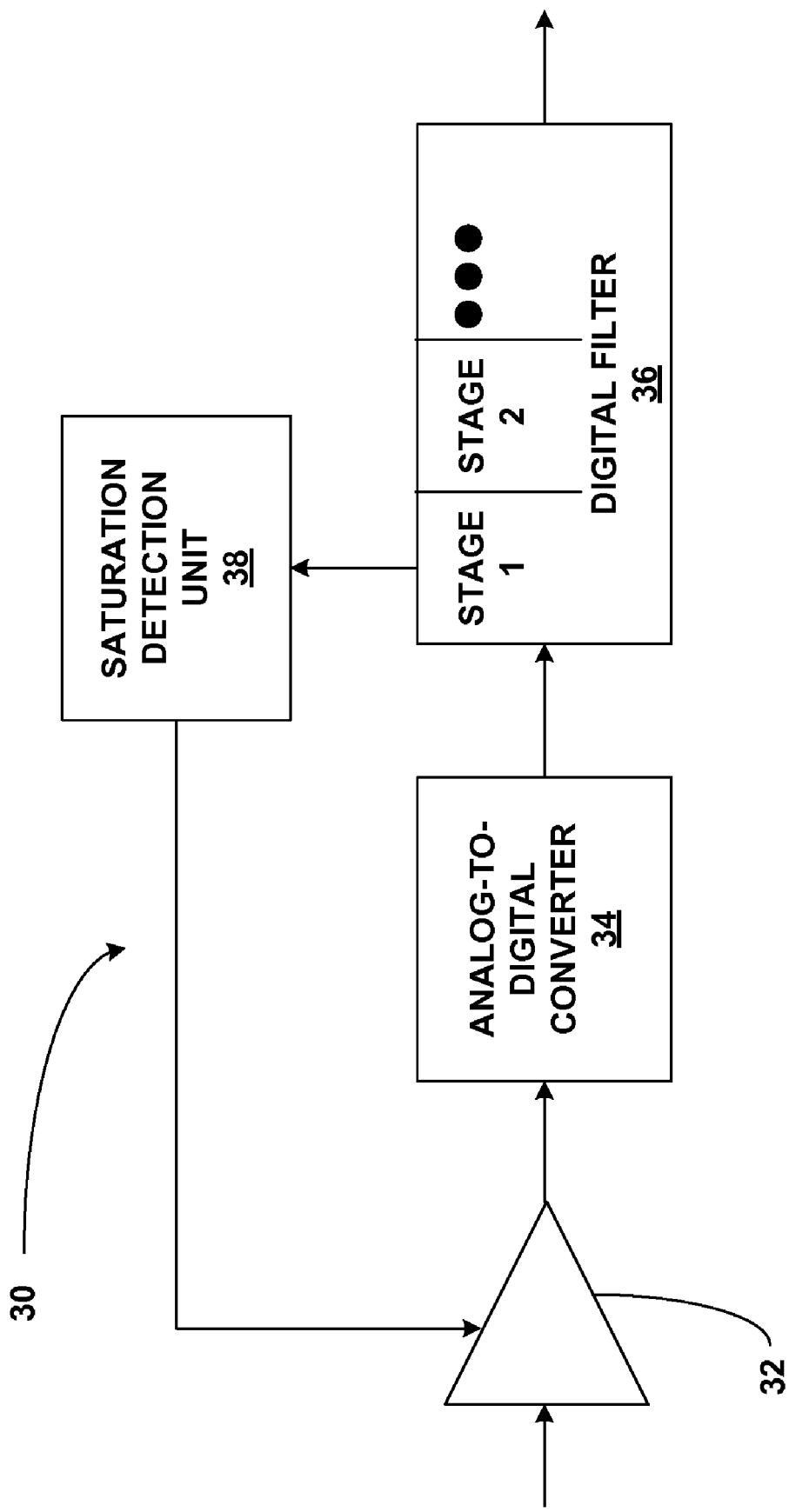
FIG. 3 is another block diagram illustrating components of a device that may implement techniques of this disclosure.

FIG. 3 a block diagram illustrating components of a device 30 that may implement techniques of this disclosure. In this case, a multi-stage digital filter 36 is implemented to digitally filter the output of analog-to-digital converter 34, and saturation detection unit 38 operates on digitally filtered output associated with a first stage of multi-stage digital filter 36.

Device 30 includes an amplifier 32 that amplifies an analog signal, and an analog-to-digital converter 34 that converts the analog signal to digital samples. By way of example, analog-to-digital converter 34 may comprise a so called "ΣΔ" analog-to-digital converter that shapes quantization noise and pushes such quantization noise to frequencies that are outside of the frequencies specifically of interest to device 30.

Amplifier 32 may be controllable via an adjustable gain such that the gain may be de-boosted and re-boosted to help avoid saturation in analog-to-digital converter 34 and to achieve good resolution in the digital samples. As in device 10 of FIG. 1, in device 30 of FIG. 3, it is desirable to apply gains to amplifier 32 that will sufficiently amplify the analog signal, but not over-amplify the signal such that saturation will occur in analog-to-digital converter 34. The techniques implemented by device 30 may be particularly useful in addressing jammer signals.

Unlike device 10 of FIG. 1, saturation detection in device 30 of FIG. 3 is not performed with respect to the immediate output of analog-to-digital converter 34. Instead, saturation detection in device 30 is performed on partially filtered output of analog-to-digital converter 34. That is to say, saturation detection unit 38 operates on digital samples following a first stage of digital filtering by multi-stage digital filter 36.

If saturation detection unit 38 identifies that saturation is probable or likely, saturation detection unit 38 may issue a command back to amplifier 32 to cause amplifier 32 to de-boost its gain. Several de-boosts may be supported in some embodiments. Each successive de-boost command may cause, e.g., a 6 decibel reduction in the analog gain of amplifier 32. Following a de-boost, saturation detection unit 38 may continue to count samples in order to identify whether a re-boost can be performed to return the gain of amplifier 32 back to its original state. In this manner, the gain of amplifier 32 can be held at a more desirable high level unless or until signal strength (possibly due to jammer signals) exceeds the saturation threshold of analog-to-digital converter 34. Other techniques, rather than issuing commands from saturation detection unit 38 to amplifier 32 could also be used to cause the gain reductions or increases in amplifier when saturation detection unit 38 detects saturation or non-saturation.

Figure 4:
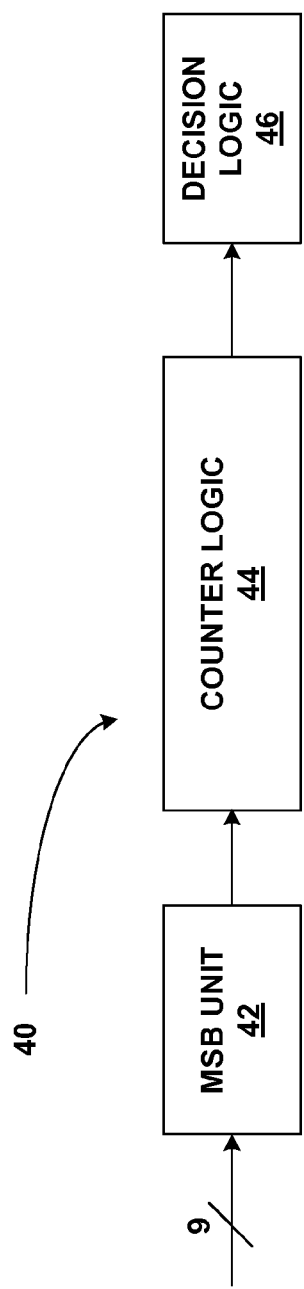
FIG. 4 is a block diagram of an exemplary saturation detection unit that may be used in the device shown in FIG. 3.

FIG. 4 is a block diagram of an exemplary saturation detection unit 40 that may correspond to unit 38 of device 30 (FIG. 3). In exemplary saturation detection unit 40, MSB unit 42 extracts a subset of the most significant bits of digital sample, which may comprise a digitally filtered sample. In this example, the digital sample may comprise nine bits, in which case, a subset of these nine bits is extracted by MSB unit 42. Counter logic 44 counts occurrences of values of different ones of the most significant bits. Based on this counting, decision logic 46 determines whether de-boosting or re-boosting of the gain of analog filter 32 (FIG. 3) is needed.

Figure 5:
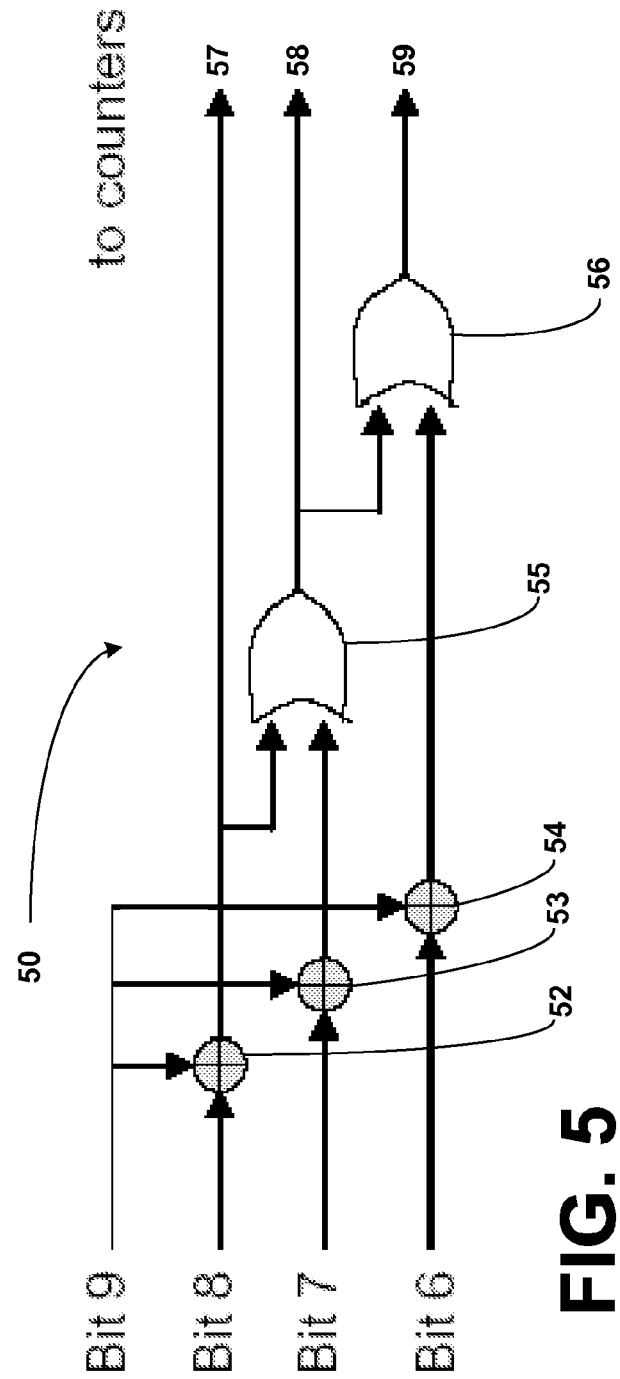
FIG. 5 is a circuit diagram illustrating an exemplary unit for processing most significant bits (MSBs), which may be used in the saturation detection unit of FIG. 4.

FIG. 5 is a circuit diagram illustrating an exemplary unit 50 for processing most significant bits, which may be used in the saturation detection unit 40 of FIG. 4. In this example, a 2's complement notion for the nine-bit digitally filtered samples is used. Unit 50 may correspond to MSB unit 42 of FIG. 4.

Nine signed bits at a first stage of a digital filter provide a very structured way to organize de-boosting and re-boosting, with the ability to better guarantee hysteresis in the de-boosting/re-boosting loop to avoid toggling between different gains. Every additional bit of a nine bit sample that turns on, at this stage, may imply an additional 6 decibels of incident power on the analog-to-digital converter. In this case, when the de-boosting/re-boosting thresholds are selected to be two bits apart, 12 dB of hysteresis can be guaranteed without requiring any additional counters to add delay for such hysteresis. Hysteresis delay, however, may be used in other embodiments to further ensure that undesirable toggling of the gain is avoided.

As shown in FIG. 5, unit 50 operates on a most significant subset of the nine bits (i.e., bit 9, bit 8, bit 7 and bit 6). In the 2's complement domain the MSB (bit 9) is a sign bit. The adders discussed below, as well as any 'summation' is meant in the logical, bit-wise sense, i.e., an exclusive-OR (XOR) operation between bits, meaning 0+0=0, 0+1=1, 1+0=1, 1+1=0. After identifying a set of at least four most significant bits of the digital values, adder 52 logically sums a first most significant bit (bit 9) and a second most significant bit (bit 8). Adder 53 logically sums the first most significant bit (bit 9) and a third most significant bit (bit 7). Adder 54 logically sums the first most significant bit (bit 9) and a third most significant bit (bit 6). The output of adder 52 is delivered to counter logic 44 (FIG. 4) and OR gate 55. OR gate 55 receives the output of adders 52 and 54. The output of OR gate 55 is delivered to counter logic 44 (FIG. 4) and OR gate 56. OR gate 55 receives the output of adder 54 and the output of OR gate 55. The output of OR gate 56 is also delivered to counter logic 44 (FIG. 4).

Unit 50 provides additional flexibility to decision logic 46 by combining different bits to facilitate intelligent counting. If the nine bits can represent 512 different values (ranging from −256 to +255), output 57 can provide an indication of whether the magnitude of a given sample is greater or less than 128. Similarly, output 58 can provide an indication of whether the magnitude of a given sample is greater or less than 64, and output 59 can provide an indication of whether the magnitude of a given sample is greater or less than 32. These different outputs 57, 58 and 59 can be used in determining whether different boosting/de-boosting thresholds have been crossed.

A hardware design like that shown in unit 50 of FIG. 5 also ensures that the influence of the sign bit (bit 9) is taken in to account when counting for active MSBs as an indication of saturation or absence thereof. Counters within counter logic 44 essentially count "bit 8 'on'," "bit 7 'on' OR bit 8 'on'," and "bit 6 'on' OR bit 7 'on' OR bit 8 'on'." In the 2's complement domain, each successive higher bit having a value of "1" can be translated to identify successive 6 decibel increases in signal power for a given sample. Counting of outputs 57, 58 and 59 can, therefore, easily translate to counting of power levels of the samples in 6 decibel increments.

Upon delivering outputs 57, 58 and 59 to counter logic 44, counter logic 44 counts occurrences of output 57 being active (or 'on'), output 58 being active (or 'on') and output 59 being active (or 'on'). In effect, counter logic 44 may deliver the percentage of time that the second most significant bit was 'on' (output 57), the percentage of time that either the second or the third most significant bits were 'on' (output 58), or the percentage of time that either the second or the third or the fourth most significant bits were 'on' (output 59). In this case, output 57 being 'on' for a high percentage of time may provide a good indication of probable saturation, while output 59 being 'on' for a low percentage of time may provide a good indication of non-saturation (absence of high magnitudes from the digital signal).

Another positive side-effect of using the nine-bit output of a first stage of digital filter 36 (FIG. 3) is that counters can be made much shorter for the power levels to be equally predictable to the two-bit example of FIG. 2. This is because much of the quantization noise of the analog-to-digital converter is typically suppressed by the first filter stage. Moreover, the counting can occur at a lower frequency while maintaining the same level of resolution in terms of power. Counting at a lower frequency is more power efficient for the device.

A simulation was performed using a circuit like unit 50 of FIG. 5. Based on the simulation, it was concluded that the counter only needed 128 samples to achieve good results. At this level, clean separation of the counter ratios by 6 decibels was observed for every additional bit brought into the OR-combination. Using these observations, one can define threshold decisions for de-boosting and re-boosting. The de-boosting threshold, for example, may be set where output 57 (FIG. 5) is active or 'on' for a fraction of time that exceeds 0.25 percent, which indicates that bit-8 is active or 'on' more than twenty-five percent of the time. The re-boosting threshold may be set where output 59 (FIG. 5) is active or 'on' for a fraction of time below 0.1, which indicates that all of bit-8, bit-7 and bit-6 are inactive (or 'off') for more than ninety percent of the time, or, equivalently, that none of bit-8, bit-7 or bit-6 is active or 'on' for more than ten percent of the time, an indication of probable non-saturation. In this case, a natural hysteresis distance of more than 12 dB separates the two thresholds. Furthermore, simulations verified that this result should not change significantly with the presence of DC offset in the signals. Of course, the thresholds may be defined differently for other embodiments.

Figure 6:
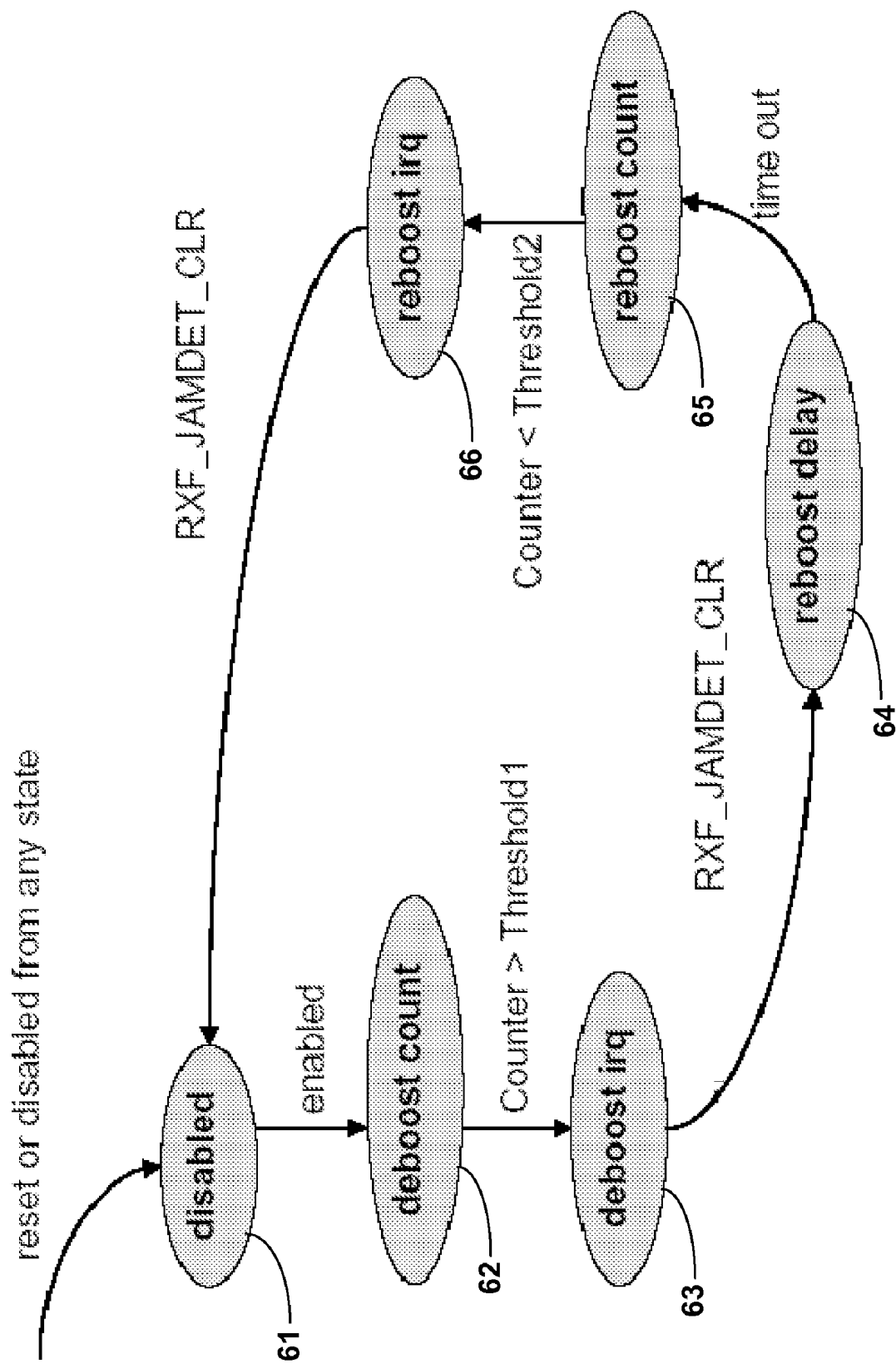
FIG. 6 is an exemplary state diagram illustrating a technique for saturation detection according to this disclosure.

FIG. 6 is an exemplary state diagram illustrating a technique according to this disclosure, which may be executed by any of the saturation detection units described herein. As shown, a saturation detection unit begins in a disabled state (61). When digital samples are generated by an analog-to-digital converter (and possibly filtered), the saturation detection unit begins a de-boost count (62). As described herein, this de-boost count occurs with respect to one or more of a subset of the bits in the digital samples. If the de-boost count is greater than a first threshold over a set of samples (e.g., more than 30 percent of the samples generate counts), a de-boost command (de-boost irq) is delivered to de-boost the analog gain of an analog amplifier (63). In this case, a record "RXF_JAMDET_CLR" may be logged to indicate the event (which may be viewed as the detection of a jammer) causing the de-boost.

A re-boost delay (64) may then be executed to help ensure that toggling between different gain states does not occur. However, this delay may be optional since, as addressed above, the techniques of circuit 50 (FIG. 5) may ensure natural hysteresis without the need for added delay. Following a time out of the re-boost delay, the saturation detection unit begins a re-boost count (65). Like the de-boost count, this re-boost count occurs with respect to one or more of a subset of the bits in the digital samples. If the re-boost count is less than a second threshold over a set of samples (e.g., less than 12 percent of the samples generate counts), a re-boost command (re-boost irq) is delivered to re-boost the analog gain of an analog amplifier back to its original gain state (66). Another record "RXF_JAMDET_CLR" may be logged to indicate the event causing the re-boost. This brings the saturation detection unit back to the disabled state (61), where the process can then repeat.

Figure 7:
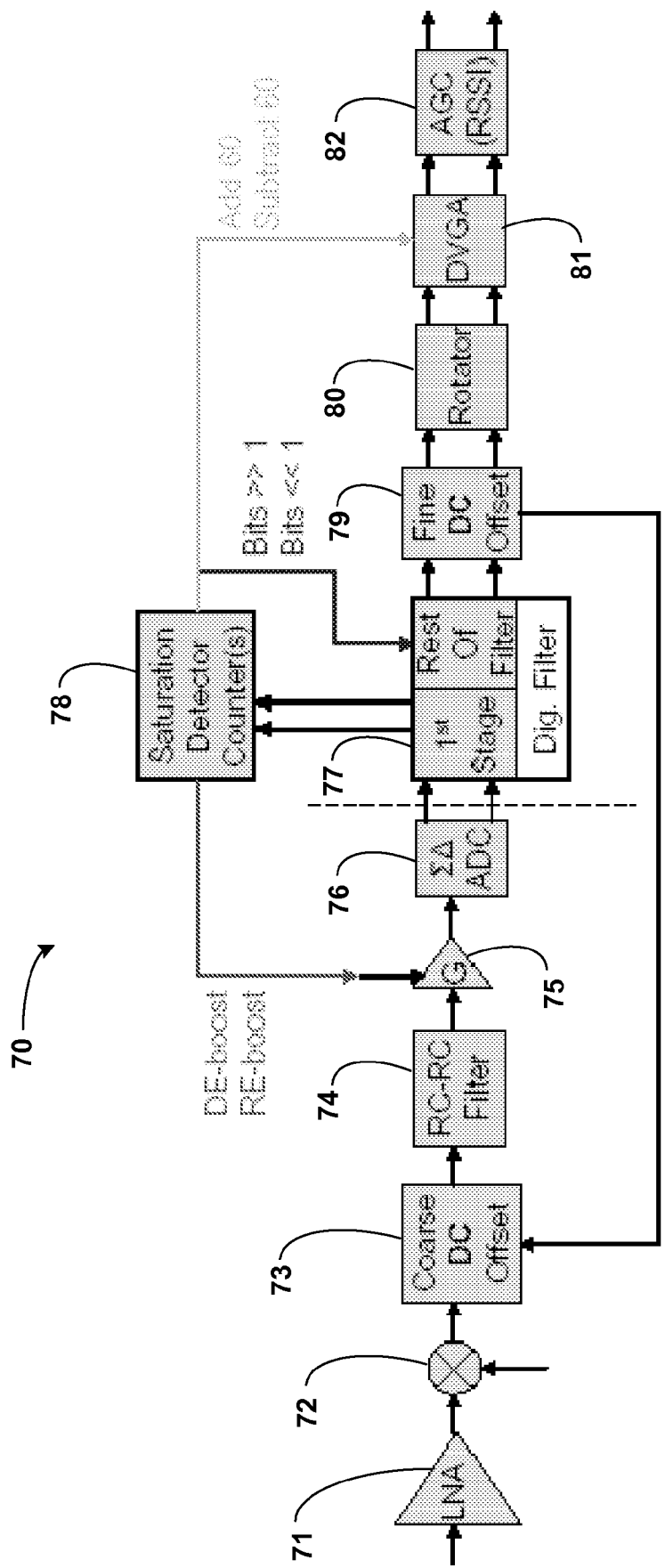
FIG. 7 is a block diagram of an exemplary wireless communication device that may implement the saturation detection techniques described in this disclosure.

FIG. 7 is a block diagram of an exemplary wireless communication device 70 that may implement the saturation detection techniques described in this disclosure. In the illustration of FIG. 7, some additional techniques are also shown, which may be performed with de-boosting and re-boosting of analog gain in the context of wireless communication. As shown in FIG. 7, wireless communication device 70 includes a first amplifier 71 that amplifies a received wireless signal. First amplifier 71 may comprise a low noise amplifier (LNA). A mixer 72 generates a baseband signal based on the received wireless signal. In particular, mixer 72 may receive an oscillating signal from a local oscillator (not shown) of device 70 and use this oscillating signal to downconvert the baseband signal from a carrier-modulated waveform of the received signal.

A coarse DC offset unit 73 removes DC offset from the baseband signal, and may operate in conjunction with a fine DC offset unit 79. In this example, coarse DC offset unit 73 operates in the analog domain, whereas fine DC offset unit 79 operates in the digital domain. Fine DC offset unit 79 may issue commands to coarse DC offset unit 73 when the dynamic range of fine DC offset unit 79 is insufficient to remove excessive DC offset in the digital domain. A filter 74 filters the baseband signal following removal of the DC offset by coarse DC offset unit 73. Filter 74 may comprise a pair of resistor-capacitor (RC) circuits.

A second amplifier 75 that amplifies the baseband signal following the filtering. Second amplifier 75 may be viewed as one of the amplifiers described above, to which de-boosting and re-boosting of gain is performed. An analog-to-digital converter 76 converts the baseband signal to digital samples. In this example, analog-to-digital converter 76 comprises a $\Sigma\Delta$ analog-to-digital converter, the output of which is represented by 2's complement notation.

A multi-stage digital filter 77 digitally filters the digital samples. A saturation detection unit 78 is implemented following a first stage of digital filter 77. In particular, saturation detection unit 78 counts occurrences of values of a subset of bits within the digital samples and identifies a probable saturation state of analog-to-digital converter 76 based on the counts. As described herein, based on these counts, saturation detection unit 78 issues de-boost and re-boost commands to second amplifier 75 or otherwise causes second amplifier 75 to reduce or increase its gain.

In some cases, it may be desirable for saturation detection unit 78 to adjust digital samples commensurate with the gain de-boosting or re-boosting applied at second amplifier 76. In one example, saturation detection unit 78 issues commands to de-boost analog gain of second amplifier 75 in response to identifying the probable saturation state, and then issues commands to perform bit shifting in a last stage of digital filter 77 to amplify the digital samples commensurate with the level of de-boosting of the analog gain. Similar commensurate bit shifting can be performed following a re-boost command. In this case, bit shifting by 1 in the last stage of digital filter 77 may be commensurate with a 6 decibel change in gain at second amplifier 76. Other techniques, rather than issuing commands could be used to effectuate these commensurate gain changes.

In another example, saturation detection unit 78 issues commands to de-boost analog gain of an amplifier in response to identifying the probable saturation state and then issues commands to adjust output of a digital voltage gain amplifier 81 commensurate with the level of de-boosting of the analog gain. Similar commensurate adjustments can be performed at digital voltage gain amplifier 81 following a re-boost command. In this case, adding or subtracting a value of 60 at digital voltage gain amplifier 81 may be commensurate with a 6 decibel change in gain at second amplifier 76. Again, other techniques, rather than issuing commands could be used to effectuate these commensurate gain changes.

The output of digital filter 77 is delivered to fine DC offset unit 79, which removes DC offset from the digital samples. As noted above, fine DC offset unit 79 may also issue commands to coarse DC offset unit 73 if needed. A rotator 80 adjusts the digital samples to account for frequency variations, which may be caused by such things as Doppler shift or frequency variations in the local oscillator of device 70.

A digital variable gain amplifier (DVGA) 81 amplifies the digital samples. An automatic gain control (AGC) unit 82 to controls the gain of DVGA. 81. AGC unit 82 may also include a residual signal strength indicator (RSSI) In any case, the output of device 70 may be demodulated in order to decode the information in the digital samples of the baseband signal. Device 70 may be designed for code division multiple access (CDMA) wireless communication, although this disclosure is not limited in this respect.

Notably, the saturation detection unit 78 forms a feedback loop to second amplifier 75 that resides within the gain adjustment loop of fine DC offset unit 79 and coarse DC offset unit 73. This is important because it ensures that gain adjustments to second amplifier 75 will not negatively impact the DC offset removal. For this reason, the commensurate adjustments to the digital samples that are performed in the last stage of digital filter 77 via bit shifting are generally preferred over commensurate adjustments to the digital samples that are performed at DVGA 81. Nevertheless the ability to control DVGA via commands from saturation detector 78 may provide a safeguard for some cases.

Figure 8:
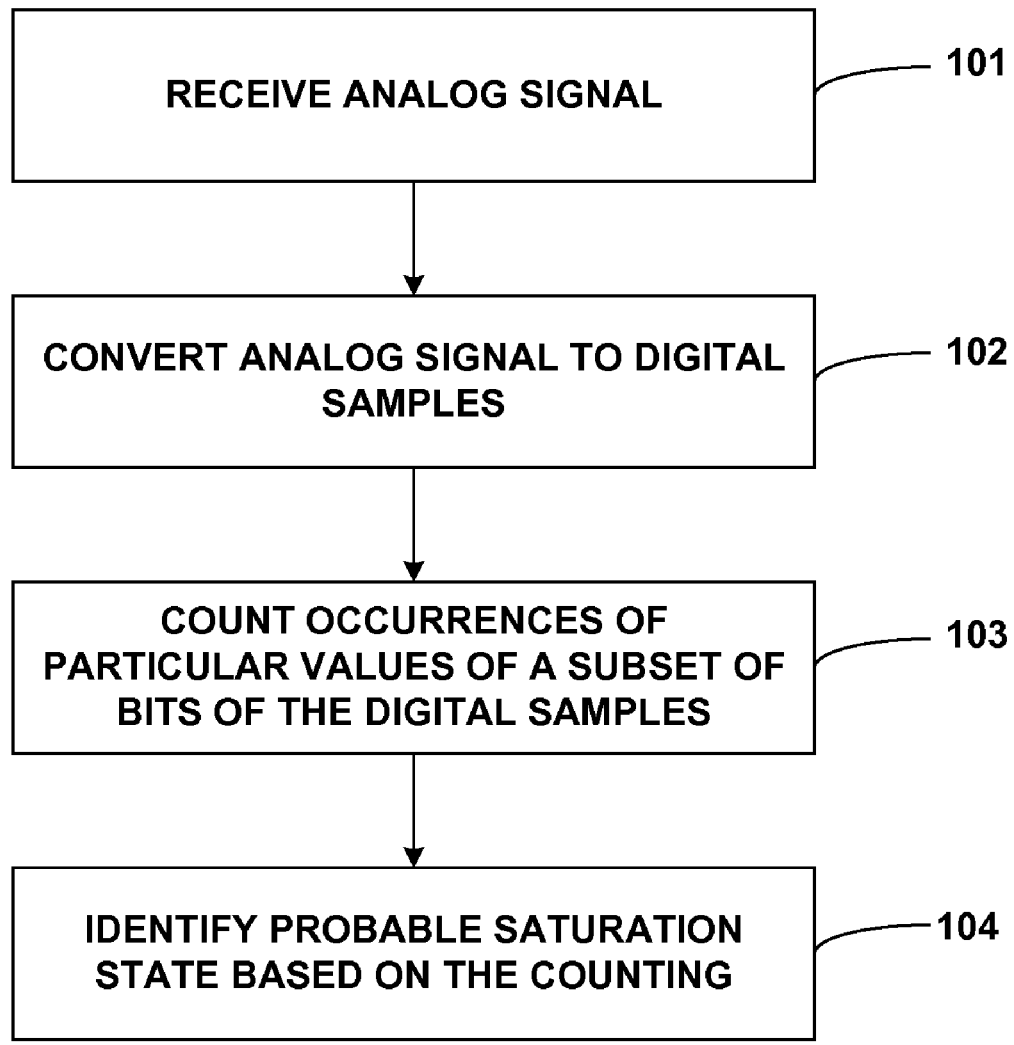
FIG. 8 is a flow diagram illustrating a technique according to this disclosure.

FIG. 8 is a flow diagram illustrating a technique according to this disclosure. FIG. 8 will be described with reference to device 30 of FIG. 3. As shown in FIG. 8, analog-to-digital converter 34 receives an analog signal from amplifier 32 (101). Analog-to-digital converter 34 converts the analog signal to digital samples (102). Following a first stage of digital filtering, saturation detection unit 38 counts occurrences of particular values (1's or 0's) of a subset of bits of the digital samples (103). The particular subset of bits that are examined, and the values (1 or 0) that are counted may depend on the bit notation used, the number of bits in the samples, and other factors. In one example, the most significant bits are examined and values of 1 are counted for the most significant bits. In this manner, saturation detection unit 38 identifies a probable saturation state based on the counting (104). As described above, in some cases more complex counting of the values of several of the most significant bits may be used. Furthermore, a decrease in gain to amplifier 32 may occur in response to identifying probable saturation. In this case, additional counting of occurrences of the values of the subset of bits, e.g., with respect to later samples, may be used to identify when saturation (following a re-boost or increase in the gain) is unlikely. In that case, the additional counting may facilitate the gain increase in analog-to-digital converter 32 back to the original state.

A number of embodiments have been described. In particular, fast and reliable techniques for detecting or predicting saturation of an analog-to-digital converter have been described. The techniques analyze digital samples following analog-to-digital conversion, and count specific values associated with one or more specific bits within the digital samples. The techniques may avoid the need to consider every bit in the digital samples, and instead rely only on a subset of bits, which can simplify the counting algorithms used in the saturation detection or prediction. The various aspects of the techniques described herein may be performed in hardware, software, firmware, or any combination thereof. Nevertheless, various modifications may be made to the techniques described without departing from the scope of the following claims. Accordingly, the specific embodiments described above, and other embodiments are within the scope of the following claims.

The invention claimed is:

1. A method comprising:

receiving an analog signal;

converting the analog signal to digital samples via an analog-to-digital converter;

counting occurrences of particular values of a subset of bits within the digital samples; and identifying a probable saturation state of the analog-to-digital converter based on the counting, and reducing analog gain of an amplifier in response to identifying the probable saturation state.

2. The method of claim 1, further comprising:
counting occurrences of additional values of the subset of bits associated with later samples;
identifying a probable non-saturation state associated with a potential increase of the analog gain; and
increasing the analog gain of the amplifier in response to identifying the probable non-saturation state.

3. The method of claim 1, wherein the digital samples comprise two or more bits, and wherein counting occurrences of particular values comprises:
identifying a least significant bit of the digital samples;
inverting values of the least significant bit of the digital samples; and
counting the inverted values.

4. The method of claim 1, wherein counting occurrences of particular values comprises:
identifying a most significant bit of the digital values; and
counting occurrences of a value of 1 for the most significant bit of the digital values.

5. The method of claim 1, wherein counting occurrences of particular values comprises:
identifying a set of most significant bits of the digital values; and
counting occurrences of a value of 1 for different ones of the most significant bits.

6. The method of claim 1, wherein the digital values are represented by 2's complement notation, and wherein counting occurrences of particular values comprises:
identifying a set of at least four most significant bits of the digital values;
counting a first logical summation of a first most significant bit and a second most significant bit;
counting a first OR output of the first logical summation and a second logical summation of the first most significant bit and a third most significant bit; and
counting a second OR output of the second logical summation and a third logical summation of the first most significant bit and a fourth most significant bit.

7. The method of claim 1, further comprising digitally filtering the digital samples, wherein counting occurrences of particular values of the subset of bits within the digital samples comprises counting occurrences of 1's or 0's associated with the digitally filtered digital samples.

8. The method of claim 1, further comprising digitally filtering the digital samples with a multi-stage digital filter, wherein counting occurrences of particular values of the subset of bits within the digital samples comprises counting 1's or 0's associated with output of a first stage of the multi-stage digital filter.

9. The method of claim 8, further comprising:
reducing analog gain of an amplifier in response to identifying the probable saturation state; and
performing bit shifting in a last stage of the multi-stage digital filter to amplify the digital samples commensurate with a level of reduction of the analog gain.

10. The method of claim 8, further comprising:
reducing analog gain of an amplifier in response to identifying the probable saturation state; and
adjusting output of a digital voltage gain amplifier commensurate with a level of reduction of the analog gain.

11. The method of claim 1, wherein counting occurrences of particular values includes counting one or more most significant bits, and wherein identifying the probable saturation state of the analog-to-digital converter based on the counting includes identifying whether the particular values are 'on' greater than a percentage amount of time.

12. The method of claim 1, wherein counting occurrences of particular values includes counting one or more least significant bits, and wherein identifying the probable saturation state of the analog-to-digital converter based on the counting includes identifying whether the particular values are 'on' greater than a percentage amount of time.

13. The method of claim 1, further comprising:
logically combining counted occurrences of the particular values; and
identifying the probable saturation state of the analog-to-digital converter based on the combining and the counting, wherein identifying the probable saturation state includes identifying whether different ones of the particular values are 'on' greater than a percentage amount of time.

14. A device comprising:
an analog-to-digital converter that converts a received analog signal to digital samples; and
a saturation detection unit that counts occurrences of particular values of a subset of bits within the digital samples and identifies a probable saturation state of the analog-to-digital converter based on the counts.

15. The device of claim 14, further comprising an amplifier that amplifies the analog signal, wherein the saturation detection unit causes a reduction of an analog gain of the amplifier in response to identifying the probable saturation state.

16. The device of claim 15, wherein the saturation detection unit:
counts occurrences of additional values of the subset of bits associated with later samples;
identifies a probable non-saturation state associated with a potential increase of the analog gain; and
causes an increase in the analog gain of the amplifier in response to identifying the probable non-saturation state.

17. The device of claim 14, wherein the digital samples comprise two bits, and wherein the saturation detection unit:
identifies a least significant bit of the digital samples;
inverts values of the least significant bit of the digital samples; and
counts the inverted values.

18. The device of claim 14, wherein the saturation detection unit:
identifies a most significant bit of the digital values; and
counts occurrences of a value of 1 for the most significant bit of the digital values.

19. The device of claim 14, wherein the saturation detection unit:
identifies a set of most significant bits of the digital values; and
counts occurrences of a value of 1 for different ones of the most significant bits.

20. The device of claim 14, wherein the digital values are represented by 2's complement notation, and wherein the saturation detection unit:
identifies a set of at least four most significant bits of the digital values;
counts a first logical summation of a first most significant bit and a second most significant bit;
counts a first OR output of the first logical summation and a second logical summation of the first most significant bit and a third most significant bit; and counts a second OR output of the second logical summation and a third logical summation of the first most significant bit and a fourth most significant bit.

21. The device of claim 14, further comprising a digital filter that digitally filters the digital samples, wherein the saturation detection unit counts occurrences of particular values associated with the digitally filtered digital samples.

22. The device of claim 14, further comprising a multi-stage digital filter that digitally filters the digital samples, wherein the saturation detection unit counts occurrences of particular values associated with output of a first stage of the multi-stage digital filter.

23. The device of claim 22, further comprising an amplifier that amplifies the analog signal, wherein the saturation detection causes:
   a reduction in analog gain of an amplifier in response to identifying the probable saturation state; and
   bit shifting in a last stage of the multi-stage digital filter to amplify the digital samples commensurate with the level of reduction of the analog gain.

24. The device of claim 22, further comprising an amplifier that amplifies the analog signal and a digital voltage gain amplifier that amplifies the digital samples, wherein the saturation detection unit causes:
   a reduction in analog gain of an amplifier in response to identifying the probable saturation state; and
   adjustment of output of a digital voltage gain amplifier commensurate with the level of reduction of the analog gain.

25. The device of claim 14, wherein the device comprises a wireless communication device.

26. A wireless communication device comprising:
   a first amplifier comprising a low noise amplifier (LNA) that amplifies a received wireless signal;
   a mixer that generates a baseband signal based on the received wireless signal;
   a coarse DC offset unit that removes DC offset from the baseband signal;
   a filter that filters the baseband signal following removal of the DC offset;
   a second amplifier that amplifies the baseband signal following the filtering;
   an analog-to-digital converter that converts the baseband signal to digital samples;
   a multi-stage digital filter that digitally filters the digital samples;
   a saturation detection unit that counts values of a subset of bits within the digital samples and identifies a probable saturation state of the analog-to-digital converter based on the counts, wherein the saturation detection counts occurrences of particular values associated with output of a first stage of the multi-stage digital filter and causes gain reductions and increases to the second amplifier based on the counts;
   a fine DC offset unit that removes DC offset from the digital samples following digital filtering;
   a rotator that adjusts the digital samples to account for frequency variations;
   a digital variable gain amplifier (DVGA) that amplifies the digital samples; and
   an automatic gain control (AGC) unit to control gain of the DVGA.

27. The device of claim 26, wherein the digital values are represented by 2's complement notation, wherein the analog-to-digital converter comprises a sigma-delta ($\Sigma\Delta$) analog-to-digital converter, and wherein the saturation detection unit:
   identifies a set of at least four most significant bits of the digital values;
   counts a first logical summation of a first most significant bit and a second most significant bit;
   counts a first OR output of the first logical summation and a second logical summation of the first most significant bit and a third most significant bit; and
   counts a second OR output of the second logical summation and a third logical summation of the first most significant bit and a fourth most significant bit.

28. A device comprising:
   means for converting a received analog signal to digital samples;
   means for counting occurrences of particular values of a subset of bits within the digital samples; and
   means for identifying a probable saturation state of the analog-to-digital converter based on the counting means for amplifying the analog signal; and means for reducing analog gain of the means for amplifying in response to identifying the probable saturation state.

29. The device of claim 28, further comprising means for logically combining counted occurrences of the particular values, wherein the means for identifying identifies the probable saturation state based on the combining and the counting.

30. A computer-program product, the computer-program product comprising a computer readable medium having instructions thereon, the instructions comprising:
   code for converting a received analog signal to digital samples;
   code for counting occurrences of particular values of a subset of bits within the digital samples; and
   code for identifying a probable saturation state of the analog-to-digital converter based on the counting means for amplifying the analog signal; and means for reducing analog gain of the means for amplifying in response to identifying the probable saturation state.

* * * * *